(12) United States Patent
Kim et al.

(10) Patent No.: US 8,253,032 B2
(45) Date of Patent: Aug. 28, 2012

(54) PRINTED CIRCUIT BOARD STRIP AND PANEL

(75) Inventors: Ki-Gon Kim, Daejeon (KR);
Kwang-Seop Youm, Cheongjoo-si (KR);
Hyoung-Won Kang, Choongcheongnam-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 376 days.

(21) Appl. No.: 12/761,828

(22) Filed: Apr. 16, 2010

(65) Prior Publication Data

US 2011/0048784 A1 Mar. 3, 2011

(30) Foreign Application Priority Data

Aug. 31, 2009 (KR) .................. 10-2009-0081211

(51) Int. Cl.
*H05K 1/11* (2006.01)
(52) U.S. Cl. ...................... 174/261; 324/765
(58) Field of Classification Search .......... 174/261; 361/767, 777; 324/765
See application file for complete search history.

(56) References Cited

U.S. PATENT DOCUMENTS

| | | | |
|---|---|---|---|
| 6,246,015 B1 * | 6/2001 | Kim | 174/261 |
| 6,469,258 B1 * | 10/2002 | Lee et al. | 174/261 |
| 7,608,788 B2 * | 10/2009 | Johnson | 174/261 |
| 2002/0145178 A1 * | 10/2002 | Tsao et al. | 257/620 |

FOREIGN PATENT DOCUMENTS

| | | |
|---|---|---|
| JP | 8-51258 | 2/1996 |
| JP | 2004-524702 A | 8/2004 |
| KR | 10-2007-0118349 | 12/2007 |
| KR | 10-2009-0054817 | 6/2009 |

OTHER PUBLICATIONS

Japanese Office Action, with partial English translation, issued in Japanese Patent Application No. 2010-108483, dated Feb. 28, 2012.
Korean Office Action issued in Korean Patent Application No. KR 10-2009-0081211 dated Jan. 4, 2011.

* cited by examiner

*Primary Examiner* — Jeremy Norris
(74) *Attorney, Agent, or Firm* — McDermott Will & Emery LLP

(57) ABSTRACT

A printed circuit board strip and a printed circuit board panel are disclosed. In accordance with an embodiment of the present invention, the printed circuit board strip includes an unit area, a plating lead-in wire, which is for plating the unit area, and a mold gate, which is disposed on an outer side of the unit area. Here, the plating lead-in wire and the mold gate are electrically connected to each other through a lead line having a shape that is bent plural times. This can significantly save the production cost by preventing an excessive plated layer from being formed in an unnecessary area.

4 Claims, 5 Drawing Sheets

PRINTED CIRCUIT BOARD STRIP AND PANEL

CROSS-REFERENCE TO RELATED APPLICATIONS

This application claims the benefit of Korean Patent Application No. 10-2009-0081211, filed with the Korean Intellectual Property Office on Aug. 31, 2009, the disclosure of which is incorporated herein by reference in its entirety.

BACKGROUND

1. Technical Field

The present invention relates to a printed circuit board and a printed circuit board panel.

2. Description of the Related Art

In semiconductor package substrates, an electronic device is mounted on the surface, or in the case of a ball grid array (BGA) substrate, electrical connection is made with another package substrate. Here, a wire bonding pad or solder ball pad is used to provide electrical connection to an electronic device or another package substrate.

FIG. 1 is a plan view of a printed circuit board strip according to the related art, and FIG. 2 is a plan view of an unit board according to the related art. As illustrated in FIG. 1, a board strip 100 includes an unit area 120, in which an unit board 130 is formed, and a dummy area 110, in which a mold gate 112 is formed, in addition to the unit area 120. Ultimately, the board strip 100 becomes a finished product by being severed into a product area (140 of FIG. 2) of the unit board 130.

As illustrated in FIG. 2, in the case of a semiconductor package substrate, a solder ball pad or wire bonding pad 134 is formed to provide electrical connection to the outside. In the solder ball pad, an organic solderability preservative (OSP) process is performed, or Ni/Au and/or other metal are plated, on the surface of a copper layer in order to prevent copper (Cu) from oxidation and improve the adhesive strength of a solder ball. In the wire bonding pad, gold plating of gold (Au) and nickel (Ni) is performed on the surface. For the gold plating, a plating lead-in wire 136 is connected to a gold-plated pad 132.

Meanwhile, as illustrated in FIG. 2, since the mold gate 112 is electrically connected to a plating lead-in wire 138 through a lead line 114, the surface of the mold gate 112 is also gold plated if gold plating is performed on the gold-plated pad 132. However, since the mold gate 112 has a relatively larger area than that of the gold-plated pad 132, an excessive gold plating on the mold gate 112 may result in an excessive increase in the production cost.

SUMMARY

The present invention provides a printed circuit board strip and a printed circuit board panel that can significantly save the production cost by preventing an excessive plated layer from being formed in an unnecessary area.

An aspect of the present invention provides a printed circuit board strip that includes an unit area, a plating lead-in wire, which is for plating the unit area, and a mold gate, which is disposed on an outer side of the unit area. Here, the plating lead-in wire and the mold gate are electrically connected to each other through a lead line having a shape that is bent plural times.

Another aspect of the present invention provides a printed circuit board panel that includes a strip area having a plurality of strips provided therein, a plating lead-in wire, which is for plating the strip area, and a dummy area, which is provided on an outer side of the strip area, Here, a metal layer for enhancing structural rigidity is provided in the dummy area, at least a portion of the metal layer is exposed for clamping during transportation of the printed circuit board panel, and the plating lead-in wire and the exposed portion of the metal layer are electrically connected to each other through a lead line having a shape that is bent plural times.

The lead line can be a plurality of lead lines. Additional aspects and advantages of the present invention will be set forth in part in the description which follows, and in part will be obvious from the description, or may be learned by practice of the invention.

DETAILED DESCRIPTION

Figure 1:
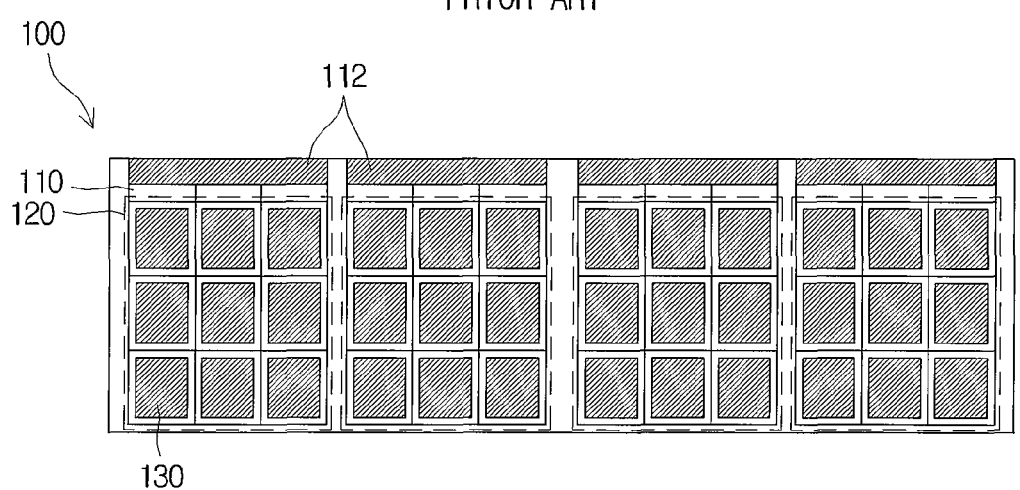
FIG. 1 shows a printed circuit board strip in accordance with the related art.
Figure 2:
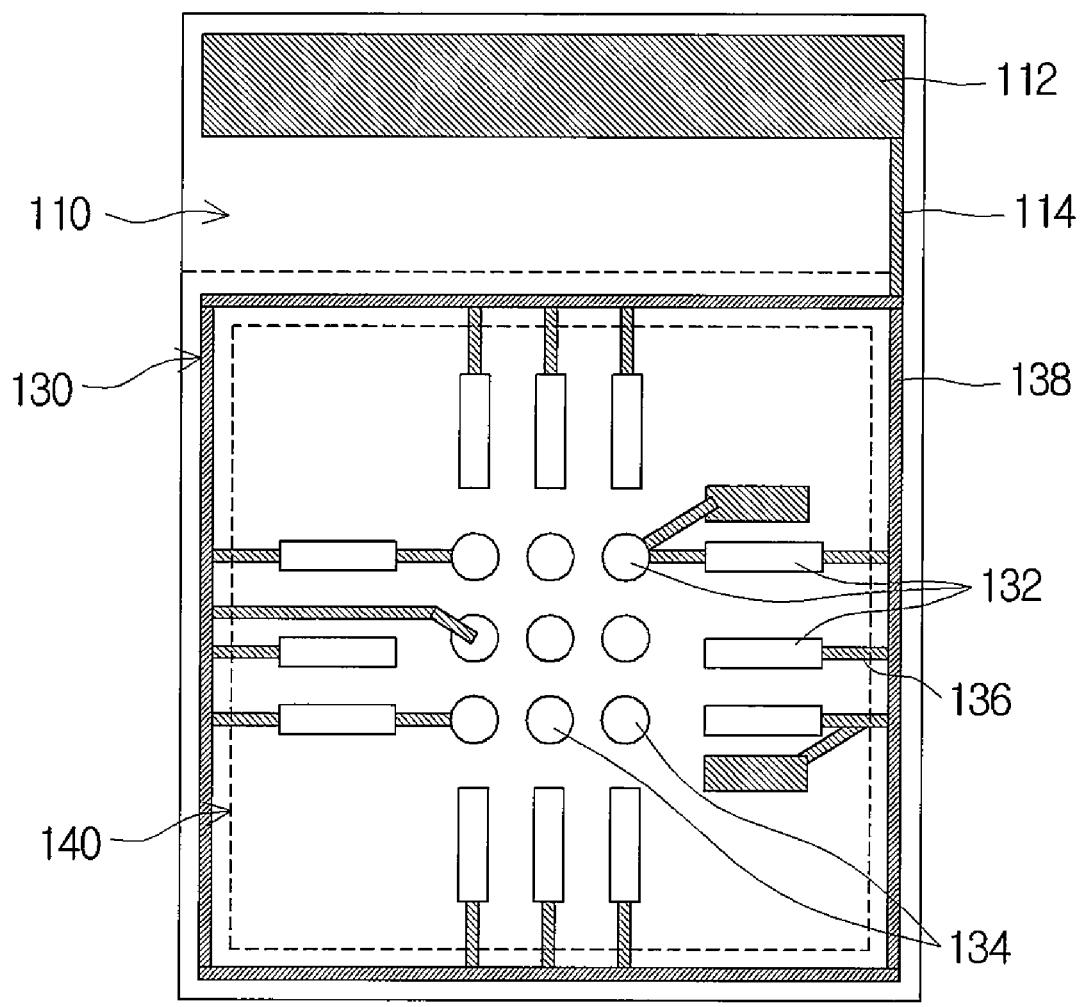
FIG. 2 is a magnified view of an unit board of FIG. 1.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention.

A printed circuit board strip and a printed circuit board panel according to certain embodiments of the present invention will be described below in more detail with reference to the accompanying drawings. Those components that are the same or are in correspondence are rendered the same reference numeral regardless of the figure number, and redundant descriptions are omitted.

Figure 3:
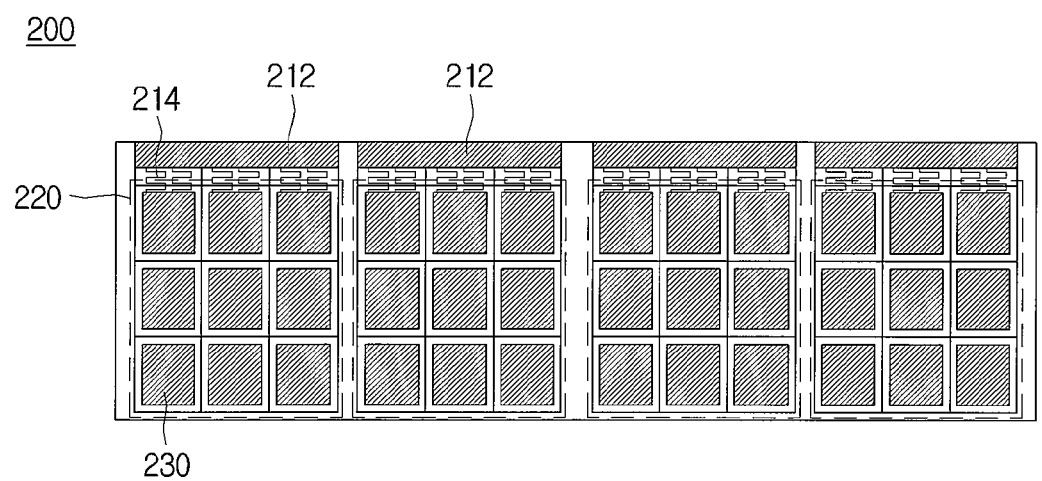
FIG. 3 shows a printed circuit board strip in accordance with an embodiment of the present invention.
Figure 4:
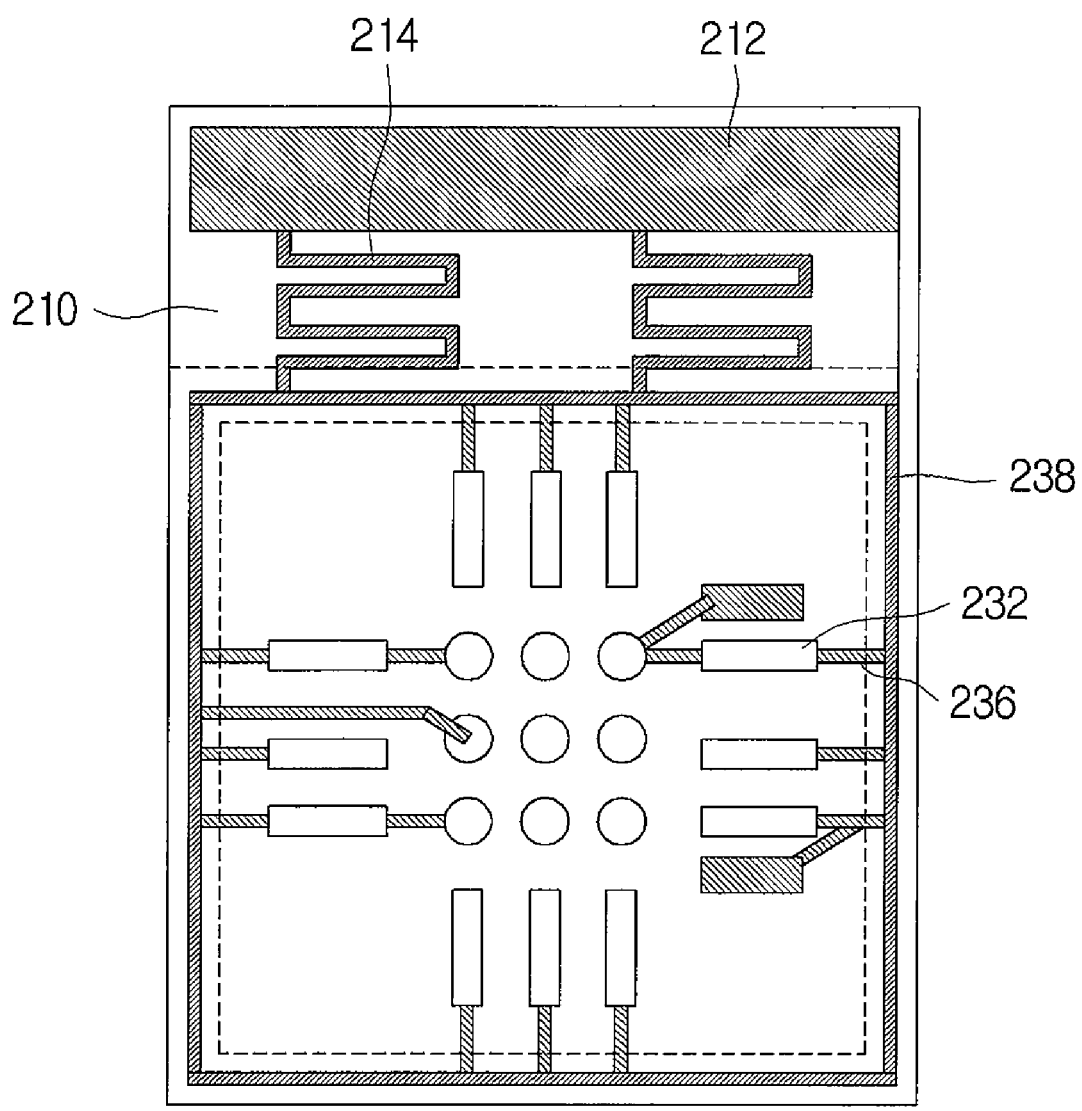
FIG. 4 is a magnified view of an unit board of FIG. 3.

FIG. 3 shows a printed circuit board strip according to an embodiment of the present invention, and FIG. 4 is a magnified view of an unit board of FIG. 3.

A printed circuit board strip 200 according to the present embodiment includes an unit area 220, in which a plurality of unit boards 230 are provided, plating lead-in wires 236 and 238, which are for plating the unit area 220, and a mold gate 212, which is disposed on an outer side of the unit area 220. The mold gate 212 is provided on the outer side of the unit area 220, i.e., in a dummy area 210, and a metal layer (not shown) is formed on the surface of the mold gate 212.

The mold gate 212, more specifically, the metal layer formed on the surface of the mold gate 212, is connected to the plating lead-in wires 236 and 238 through a lead line 214. Through this structure, while the unit area 220 is surface-treated, for example, gold plated, a gold plated layer for a molding process through resin injection can be also formed on the metal layer formed on the surface of the mold gate 212 since an electric current is applied to the metal layer.

However, since the mold gate 212 has a relatively larger area than those of some portions of the unit area 220, on which a gold plated layer is formed, a relatively large amount of gold plated layer may be formed on the surface of the mold gate 212. Moreover, since the mold gate 212 is not included in the final product, forming a plated layer with the expensive gold on the mold gate 212 can be an obstacle to saving the cost of production.

Considering the problems described above, the present embodiment provides a structure in which the mold gate 212 and the plating lead-in wire 238 are electrically connected to each other through the lead line 214 that is bent plural times. That is, by making the lead line 214, which connects the mold gate 212 and the plating lead-in wire 238 to each other, thinner and longer, the resistance between the mold gate 212 and the plating lead-in wire 238 becomes greater, thereby reducing the magnitude of electric current being applied to the mold gate 212.

Accordingly, by reducing the magnitude of electric current being applied to the mold gate 212, a relatively thinner gold plated layer can be formed on the mold gate 212 when gold is later electroplated, thus preventing the unnecessary waste of gold.

Meanwhile, if the lead line 214 is formed thinner and longer to reduce the magnitude of the electric current being applied to the mold gate 212, the lead line 214 may be broken so that the electric current may not be applied to the mold gate 212, resulting in the problem of not forming the gold plated layer at all. To solve this problem, as illustrated in FIGS. 3 and 4, a plurality of lead lines 214 connecting the mold gate 212 and the plating lead-in wire 238 to each other can be provided in parallel. In this case, even though one of the plurality of lead lines 214 is disconnected, the mold gate 212 and the plating lead-in wire 238 can be electrically connected to each other by the remaining lead lines 214, which are connected in parallel, eliminating the chance of not having the gold plated layer formed on the mold gate 212 at all.

Figure 5:
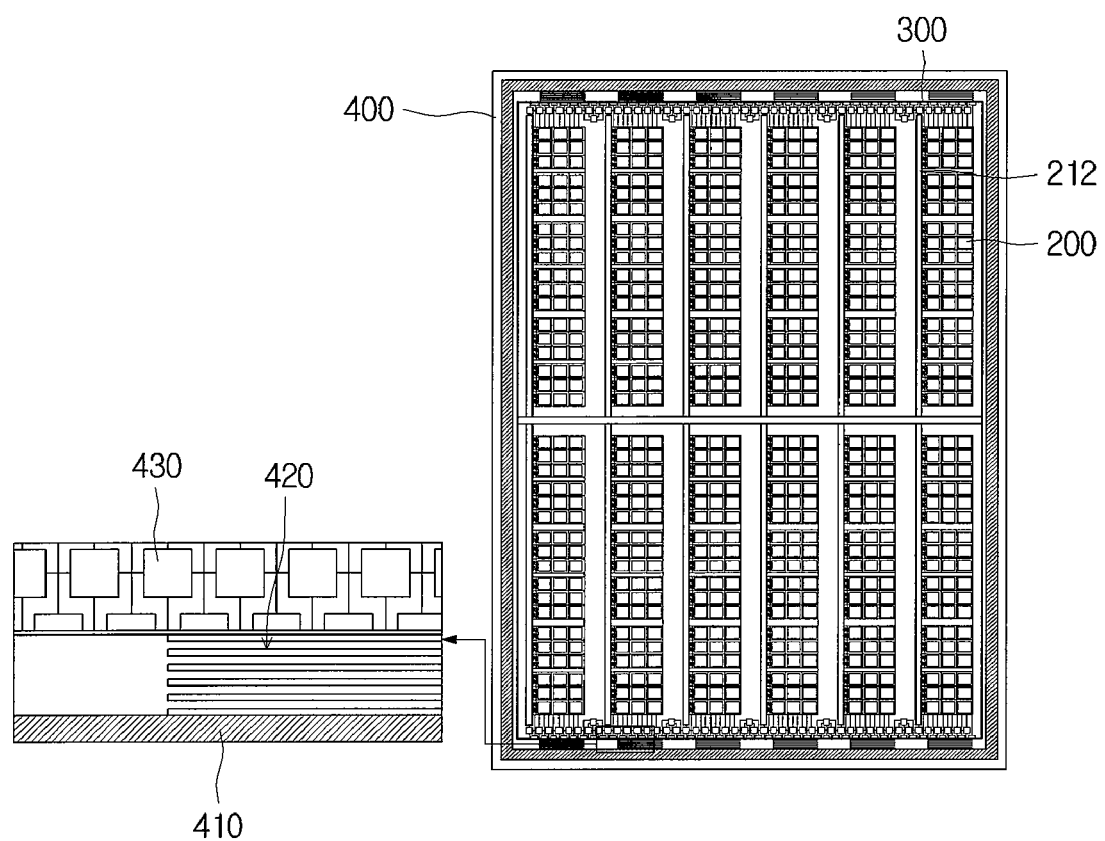
FIG. 5 shows a printed circuit board panel in accordance with another embodiment of the present invention.

FIG. 5 shows a printed circuit board panel according to another embodiment of the present invention. The printed circuit board according to the present embodiment includes a strip area 300, which is provided on an inner side, a plating lead-in wire, which is for plating the strip area 300, and a dummy area 400, which is provided on an outer side of the strip area 300. Here, a metal layer 410 can be provided in the dummy area 400 in order to enhance the structural rigidity, and at least a portion of the metal layer 410 is exposed for clamping during a possible transportation.

In case a thin type of printed circuit board is manufactured, an insulator used as an insulating material may be too thin for the handling of the material for various processes. Considering this, a metal layer 410, such as a copper thin film, can be provided in the dummy area 400. Although the metal layer 410 can be provided separately in order to enhance the structural rigidity of the dummy area 400, it can also be a portion of a metal plate that is stacked on the entire surface of an insulator to form an inner layer circuit.

In the case of the thin type printed circuit board, a clamp is used lest the printed circuit board be warped while the printed circuit board is dipped in a plating bath and then removed from the plating bath. Here, at a portion of the printed circuit board to be clamped, an insulator or solder resist (SR) needs to be removed from the surface of the printed circuit board in order to expose the printed circuit board. If the insulator or SR formed at the clamped portion of the surface is not removed, a foreign substance, i.e., the insulator or SR, may be stuck to the clamp, which is repeatedly used for several printed circuit boards, so that another printed circuit board that is clamped later may be stained by the foreign substance.

As such, the portion of the metal layer 410, which is exposed for clamping, can be connected to the plating lead-in wire (refer to reference numeral 238 in FIG. 4). Through this structure, while the strip area 300, more specifically, the unit area (refer to reference numeral 220 in FIG. 3) inside the strip area 300, is surface-treated, for example, gold plated, a gold plated layer can be also formed on the exposed surface of the metal layer 410.

However, since the exposed portion of the metal layer 410 in the dummy area 400 does not remain in the final product, forming the expensive gold plated layer excessively on the exposed metal layer 410 hampers the effort to save the cost of production.

Considering the problem described above, the present embodiment provides a structure in which the exposed portion of the metal layer 410 in the dummy area 400 and the plating lead-in wire are electrically connected to each other through the lead line 420 that is bent plural times. That is, by making the lead line 420 connecting the exposed metal layer 410 in the dummy area 400 and the plating lead-in wire (refer to reference numeral 238 in FIG. 4) to each other thinner and longer, the resistance between the exposed portion of the metal layer 410 and the plating lead-in wire becomes greater.

As such, if the magnitude of electric current being applied to the exposed portion of the metal layer 410 in the dummy area 400 is decreased, a relatively thinner gold plated layer can be formed on the exposed metal layer 410 by the electroplating of gold, thus preventing the gold from being unnecessarily wasted.

In this embodiment, like the previously described embodiment, a plurality of lead lines can be provided in parallel.

To prevent the panel from being pulled apart during the production process, a rectangular metal pattern 430 can be repeatedly formed in the dummy area 400, as illustrated in FIG. 5. In this case, the lead line 420 can be electrically connected to the plating lead-in wire through the rectangular metal pattern 430.

In the printed circuit board having the above structure, sludge can be prevented from being generated by reducing the thickness of plating formed on the exposed metal layer 410. As a result, it becomes fundamentally possible to prevent a drop in product reliability caused by the sludge while units are plated.

While the spirit of the present invention has been described in detail with reference to particular embodiments, the embodiments are for illustrative purposes only and shall not limit the present invention. It is to be appreciated that those skilled in the art can change or modify the embodiments without departing from the scope and spirit of the present invention.

As such, many embodiments other than those set forth above can be found in the appended claims.

What is claimed is:

1. A printed circuit board strip comprising:
   an unit area;
   a plating lead-in wire for plating the unit area; and
   a mold gate disposed on an outer side of the unit area,
   wherein the plating lead-in wire and the mold gate are electrically connected to each other through a lead line having a shape that is bent plural times.

2. The printed circuit board strip of claim 1, wherein the lead line is a plurality of lead lines.

3. A thin printed circuit board panel comprising:
   a strip area having a plurality of strips provided therein;
   a plating lead-in wire for plating the strip area; and
   a dummy area provided on an outer side of the strip area,
   wherein a metal layer for enhancing structural rigidity is provided in the dummy area,
   at least a portion of the metal layer is exposed for clamping during transportation of the printed circuit board panel, and the plating lead-in wire and the exposed portion of the metal layer are electrically connected to each other through a lead line having a shape that is bent plural times.

4. The printed circuit board panel of claim 3, wherein the lead line is a plurality of lead lines.

* * * * *